United States Patent [19]

Grandia

[11] 3,808,471

[45] Apr. 30, 1974

[54] EXPANDIBLE PRESSURE MOUNTED SEMICONDUCTOR ASSEMBLY

[75] Inventor: William M. Grandia, Jacobus, Pa.

[73] Assignee: Borg-Warner Corporation, Chicago, Ill.

[22] Filed: Oct. 26, 1972

[21] Appl. No.: 301,041

[52] U.S. Cl....... 317/234 R, 317/234 A, 317/234 H, 317/234 P, 317/234 W, 165/105

[51] Int. Cl............................. H01l 3/00, H01l 5/00

[58] Field of Search.............. 317/234, 6, 11, 1, 4.1; 165/80, 105

[56] References Cited

UNITED STATES PATENTS

| | | | |
|---|---|---|---|
| 3,280,389 | 10/1966 | Martin | 317/234 P |
| 3,413,532 | 11/1968 | Boyer | 317/234 P |
| 3,603,381 | 9/1971 | Scherbaum | 317/235 P |
| 3,652,903 | 3/1972 | Eriksson et al. | 317/234 A |

FOREIGN PATENTS OR APPLICATIONS

| | | | |
|---|---|---|---|
| 1,076,237 | 7/1967 | Great Britain | 317/234 |

*Primary Examiner*—Andrew J. James
*Attorney, Agent, or Firm*—Donald W. Banner

[57] ABSTRACT

A semiconductor assembly having a plurality of semiconductors seriately interposed between electricity conducting heatsinks with each semiconductor contacting at least one side of a heatsink, electricity conducting members extending through the heatsinks and connected to certain of the semiconductors for providing electrical current to the heatsinks and thereby to the semiconductors, electrical insulation being between the electricity conducting members and the remaining heatsinks.

2 Claims, 2 Drawing Figures

EXPANDIBLE PRESSURE MOUNTED SEMICONDUCTOR ASSEMBLY

BACKGROUND AND SUMMARY OF THE INVENTION

This invention relates to semiconductor assemblies and more particularly to an improved semiconductor-mounting assembly for energizing the semiconductor components of the assembly.

The present invention is directed to an improved semiconductor assembly providing a compact power-handling circuit with semiconductor components which can operate at power levels substantially greater than was possible with prior energizing and cooling configurations.

More particularly, the invention concerns an improved semiconductor assembly in which the semiconductors are seriately interposed between heat conducting and electricity conducting elements with each semiconductor contacting at least one side of an element, electricity conducting members extending through the elements and connected to certain of the semiconductors for providing electrical current to the elements and thereby to the semiconductors, and electrical insulation between the electricity conducting members and the remaining elements.

DESCRIPTION OF THE PREFERRED EMBODIMENT

Figures 1, 2:
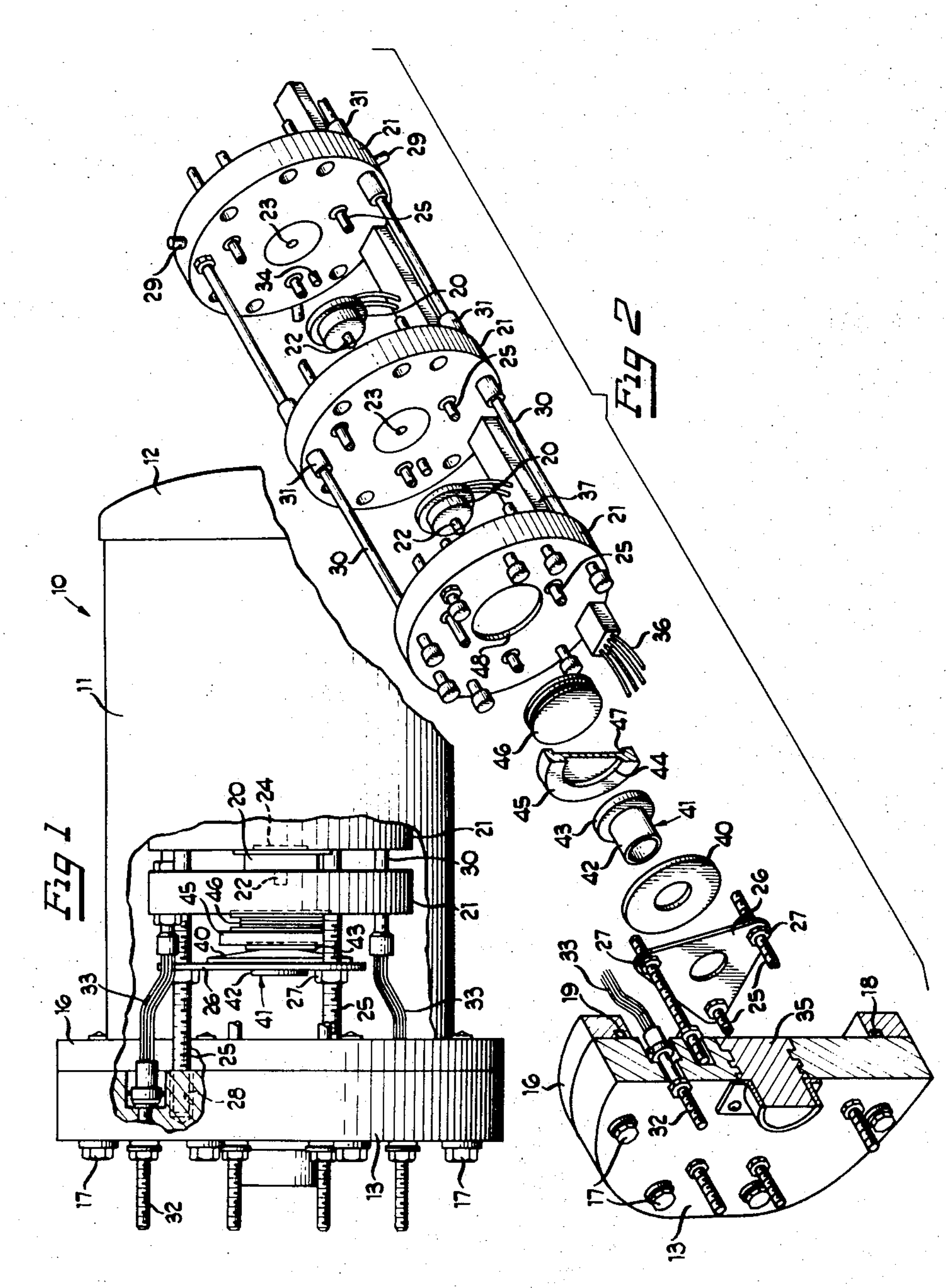
FIG. 1 is an elevational view, with certain portions broken away, of a semiconductor assembly embodying the invention.
FIG. 2 is an exploded perspective view showing the various parts of the semiconductor assembly.

Referring now to the drawings, a semiconductor assembly is shown constructed in accordance with the principles of the invention and comprising a housing 10 provided by a cylindrical shell or casing 11 having a wall 12 closing one end thereof, and a cover plate 13 closing the other end of the shell. The shell 11 has a flange 16 to which plate 13 is secured by fasteners 17. A seal 18 is disposed in groove 19 to provide a fluid-tight housing. The housing 10 may be filled with a liquid refrigerant for cooling the semiconductor assembly.

In the present disclosure, it is believed a description of the semiconductor assembly shown in the drawing will suffice for a clear understanding of the invention. Semiconductors are conventionally arranged in a stacked series longitudinally of the housing. The semiconductors are identified by the numeral 20 and have flat pancake or "hockey-puck" shapes. The semiconductors are positioned seriately between, and engage, heat conducting members in the form of plates or discs providing heatsinks 21 of a good heat conducting and electricity conducting material. The semiconductors are held in engaged relation to the heatsinks by pins 22 on the semiconductors extending into openings 23 in the heatsinks and by reduced end portions 24 on the semiconductors positioned within recesses in the heatsinks.

The heatsinks 21 and semiconductors 20 are held together by a frame structure comprising a plurality of tie members in the form of bars 25 and plates 26, the tie bars being provided with nuts 27 to adjustably position the end plates 26 in predetermined spaced relation to each other axially of the structure. The ends of the tie bars also extend within openings 28 in the cover plate 12 for connecting the frame structure, heatsinks, semiconductors, and other component parts of the device now to be described, to the coverplate. Insulating pins 29, on a heatsink 21, serve to center the assembly in the shell.

A plurality of electricity conducting members in the form of busbars 30 are positioned on and extend through the heatsinks 21, the busbars being insulated from the heatsinks or connected to the heatsinks where required. More particularly, where a busbar penetrates a heatsink and no electrical connection is desired, insulation 31 is applied to the busbar. The tie bars 25 are insulated over their entire length. The electric power enters the terminals 32, mounted in cover plate 13, which is formed of insulation material, through flexible connections 33 to the busbars 30. The flexible connections are effective to prevent strain on the heatsinks, and thereby on the semiconductors. The current travels through the heatsinks to the contact area and to the semiconductors. The anode and the cathode voltages for the semiconductors are applied over the busbars and heatsinks. Locating pins 34 keep the semiconductor properly centered. The control circuitry enters through a plug socket 35 and electricity conducting wires 36 are encased in an epoxy bar 37 with connections to the semiconductors, where required.

The mounting arrangement for the semiconductors is directed to providing maintenance of a uniform controlled compressive load on the semiconductors and heatsinks to insure maintaining continuous good contact therebetween. For this purpose, the compressive force-applying means for obtaining this desirable result, and also proper positioning of the semiconductors and heatsinks, includes two force-applying and load-equalizing means respectively located at opposite ends of the assembly. Since they are similar, it is believed a description of one will suffice to provide an adequate disclosure. Each comprises a Belleville type spring 40 operating to maintain constant pressure on the semiconductors and heatsinks by acting to push against a centering bushing collar 41 having a cylindrical portion 42 extending through and slidingly positioned within aligned openings in the spring 40 and end plate 26 and the plug socket 35. The spring is adjustable by movement of end plate 26 to vary its compression. The bushing collar 41 has a flange 43, at one end of the cylindrical portion 42 thereof, received within an annular cavity 44 of a plate 45, formed of insulation material, and engaging the plate 45. A liquid-filled bellows 46, of wafer form, has its opposite ends positioned within annular cavities 47 and 48 in the plate 45 and heatsink 21 and engaging the plate 45 and heatsink 21, as shown in FIG. 1. The Belleville type spring is operative to transmit pressure through the collar 41 and plate 45 to the load-equalizing bellows 46 and then to the contiguous heatsink. It will be apparent that pressure is applied to the semiconductors and heatsinks with a clamping action by the springs, which are located at both ends of the stack, which may hold as many as 10 or 12 semiconductors. The bellows 46 transfers pressure of the springs 40 to the entire stack of semiconductors with complete conformance to stacking errors.

Important aspects of the present invention will be clearly apparent from a consideration of the following features. The assembly arrangement is effective to provide cooling of both sides of each heat generating device or semiconductor, such as diodes, SCR's, or transistors, by means of a single heatsink plate, this same plate forming an electricity conducting member to one or more of the semiconductors. Wherever separate electrical connections are needed for adjacent devices, the heatsink plates are separated by an electrical insulator without diminishing the cooling effect to either device. The pressure forces necessary to establish electrical contact and simultaneous heat transfer contact are produced by the adjustable springs 40, the force being transmitted by the bellows 46, which are solidly filled with a hydraulic fluid and chosen to be of such shape that it has nearly an infinite modulus in the direction of the force of the springs, with nearly zero modulus when rotated at right angles to the axis of infinite modulus, requiring the bellows to be axially short and to have a relatively large diameter. Also, the electrical connections to the devices are made near the periphery of the heatsink plates which provide the cooling means and, accordingly, also the electrical conducting means for the devices.

While this invention has been described in connection with a certain specific embodiment thereof, it is to be understood that this is by way of illustration and not by way of limitation; and the scope of the appended claims should be construed as broadly as the prior art will permit.

What is claimed is:

1. A semiconductor assembly comprising a plurality of spaced heat conducting and electricity conducting elements; a plurality of semiconductors seriately interposed between said elements with each semiconductor contacting at least one side of an element; electricity conducting members extending through and positioned on said elements and connected to certain of said semiconductors for providing electrical current to said elements and thereby to said semiconductors; electrical insulating means between said electricity conducting members and the remaining elements; and fastening means, also extending through said elements, for holding said elements, semiconductors, and said electricity conducting members in assembly.

2. A semiconductor assembly according to claim 1 in which the anode and cathode voltages for said diodes are applied over said electricity conducting members and said elements.

3. A semiconductor assembly according to claim 2 in which the anode and cathode voltages for said semiconductors are applied over said electricity conducting members and said elements.

4. A semiconductor assembly according to claim 1 in which said holding means include plates, and the bars connected to said plates to space said plates in fixed relation to each other, said tie bars extending through said elements and supporting said elements, and thereby said semiconductors and said electricity conducting members.

* * * * *

UNITED STATES PATENT OFFICE
CERTIFICATE OF CORRECTION

Patent No. 3,808,471 Dated April 30, 1974

Inventor(s) William M. Grandia

It is certified that error appears in the above-identified patent and that said Letters Patent are hereby corrected as shown below:

Cancel - claims 2 and 3.

Claim 4, line 2, cancel "holding" and substitute -- fastening --.

Claim 4, line 2, change "the bar" to -- tie bar --.

Signed and sealed this 1st day of October 1974.

(SEAL)
Attest:

McCOY M. GIBSON JR.
Attesting Officer

C. MARSHALL DANN
Commissioner of Patents